United States Patent
Vellianitis et al.

(10) Patent No.: US 8,709,885 B2
(45) Date of Patent: Apr. 29, 2014

(54) SCHOTTKY DIODE AND METHOD OF MANUFACTURE

(75) Inventors: Georgios Vellianitis, Redhill Surrey (GB); Gilberto Curatola, Redhill Surrey (GB); Kyriaki Fotopoulou, Redhill Surrey (GB); Nader Akil, Redhill Surrey (GB)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 59 days.

(21) Appl. No.: 13/500,405

(22) PCT Filed: Nov. 17, 2010

(86) PCT No.: PCT/IB2010/055238
§ 371 (c)(1),
(2), (4) Date: Apr. 5, 2012

(87) PCT Pub. No.: WO2011/061696
PCT Pub. Date: May 26, 2011

(65) Prior Publication Data
US 2012/0228717 A1    Sep. 13, 2012

(30) Foreign Application Priority Data
Nov. 23, 2009  (EP) .................................. 09176772

(51) Int. Cl.
*H01L 21/338*    (2006.01)
(52) U.S. Cl.
USPC ................ 438/169; 438/583; 257/E21.359
(58) Field of Classification Search
CPC ............... H01L 21/28537; H01L 27/095
USPC ................ 438/169, 583; 257/E21.359
See application file for complete search history.

(56) References Cited

U.S. PATENT DOCUMENTS

| | | | |
|---|---|---|---|
| 7,589,007 B2* | 9/2009 | Thornton et al. | 438/597 |
| 7,943,472 B2* | 5/2011 | Pendharkar et al. | 438/379 |
| 2004/0012066 A1 | 1/2004 | Dietl et al. | |
| 2006/0223246 A1 | 10/2006 | Ma et al. | |
| 2006/0246680 A1 | 11/2006 | Bhattacharyya | |
| 2007/0069306 A1 | 3/2007 | Kapoor et al. | |
| 2008/0296721 A1 | 12/2008 | Girdhar et al. | |

FOREIGN PATENT DOCUMENTS

| | | |
|---|---|---|
| JP | 2006132649 A | 2/2006 |
| JP | 2008166560 A | 7/2008 |

OTHER PUBLICATIONS

The International Search Report dated Feb. 16, 2011.

* cited by examiner

*Primary Examiner* — Chandra Chaudhari
(74) *Attorney, Agent, or Firm* — McClure, Qualey & Rodack, LLP

(57) ABSTRACT

A method of manufacturing Schottky diodes in a CMOS process includes forming wells, including first wells (16) for forming CMOS devices and second wells (18) for forming Schottky devices. Then, transistors are formed in the first wells, the second wells protected with a protection layer (20) and suicide contacts (40) formed to source and drain regions in the first wells. The protection layer is then removed, a Schottky material deposited and etched away except in a contact region in each second well to form a Schottky contact between the Schottky material (74) and each second well (18).

18 Claims, 5 Drawing Sheets

SCHOTTKY DIODE AND METHOD OF MANUFACTURE

CROSS-REFERENCE TO RELATED APPLICATION

Figure 1:
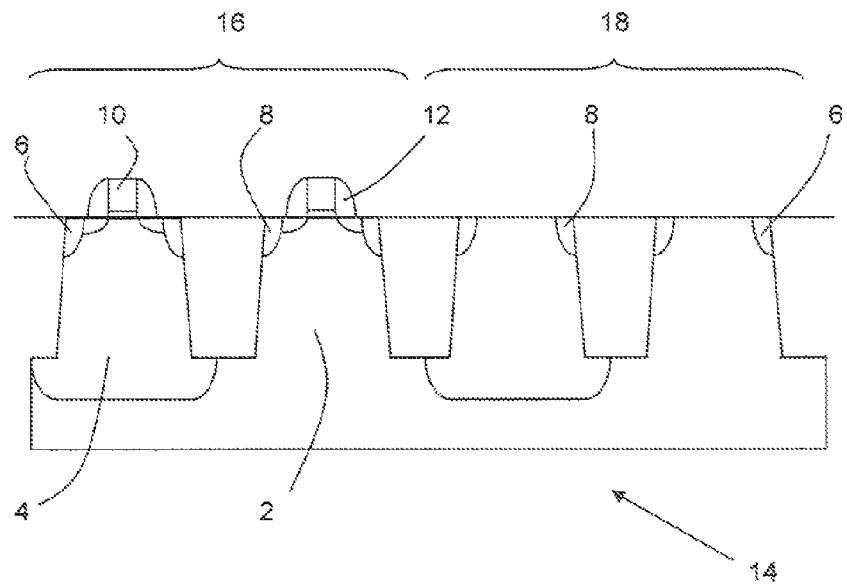

This application is the 35 U.S.C. §371 national stage of PCT application "Schottky Diode and Method of Manufacture," having serial number PCT/IB2010/055238, filed on Nov. 17, 2010 which claims priority to and benefit of European Patent Application No. 09176772.3, filed on Nov. 23, 2009, both of which are incorporated by reference in their entireties.

The invention relates to Schottky diodes and methods of manufacture.

The semiconductor diode, with two terminals represents one of the most fundamental semiconductor devices which are used widely over the last decades for several applications. The usefulness of a diode comes from its unique property of allowing electrical current to flow when the potential at the anode is higher than the one in the cathode (forward region) but blocking it when the polarity is reversed (reverse region). The current is zero for negative voltage while it is increasing exponentially for positive voltages.

Diodes will allow current to pass only when the applied forward voltage is higher than the characteristic forward voltage drop $V_f$ of the diode. Further, applying a reverse voltage the current is not zero since a small current is still allowed to pass and if the reverse voltage exceeds the breakdown voltage $V_{BR}$ (characteristic of the diode) then the current increases dramatically. Due to these non-ideality factors ($V_f$, $V_{BR}$), different diodes are used depending on the application.

There are a lot of diode types and each one of them has advantages and disadvantages depending on the application. Some diode examples are the p-n, the Schottky and the MOSFET. In such diodes, both $V_f$ and $V_{BR}$ can be adjusted by changing the doping of the semiconductor and the work function of the metal, the latter only in the case of the Schottky diode and MOSFETs. This is very important because different circuits require different diode characteristics. For example, a normal p-n diode has a Vf above 0.7 volt, while a Schottky diode voltage drop is between 0.15-0.45.

Certain applications require the use of diodes with low $V_f$ values and this is where Schottky diodes are attractive. Indeed, the intrinsically low $V_f$ value of a Schottky diode is its main characteristic which translates into higher system efficiency. For example, if we need to rectify an alternating current (AC) signal with small amplitude, then a small $V_f$ is necessary in order to have any output signal ($V_f$ should be smaller than the AC signal amplitude).

A more specific example where a low forward voltage drop is desirable is a charge pump circuit which is used for rectification and amplification purposes in an RFID tag. Such a circuit will receive a small AC signal with amplitude $V_{in}$ and will rectify/amplify it to a value of approximately:

$$V_{out} = 2 \cdot n \cdot (V_{in} - V_f) \quad (1)$$

where n is the number of charge pump circuits (stages) in series.

From equation (1) we see that in order to have an output voltage, $V_f$ should be lower than $V_{in}$. Taking into account that $V_{in}$ depends on the distance between RF signal emitter and receiver (the longer the distance between them, the smaller the $V_{in}$), having a low $V_f$ implies that the RFID can operate at even greater distances. Furthermore, even at a fixed distance between RFID tag and RF signal emitter, a low Vf implies higher power efficiency (how much of the input signal will pass through the diode).

Unfortunately, the fabrication of a Schottky diode using existing CMOS processing steps used in the manufacture of RFID tags is not straightforward.

US 2006/0246680 describes a partially depleted silicon-on-insulator structure. The structure includes a well region formed above an oxide insulation layer. The well region is a multilayer epitaxy that includes a silicon germanium (Si—Ge) layer. The well region includes a number of recombination centers between the Si—Ge layer and the insulation layer. A source region, a drain region, a gate oxide layer, and a gate are formed. The Si—Ge layer includes a number of recombination centers in the source/drain regions. A metal silicide layer and a lateral metal Schottky layer are formed above the well region to contact the source region and the well region.

JP 2006-32649 describes providing a semiconductor device including a Schottky diode and a manufacturing method thereof. In the Schottky diode, the impurity concentration distributed in the surface region of a well region is smaller than that in the well region, the impurity concentration distributed in a region at a predetermined depth deeper than the surface region of the well region is larger than that in the well region, those impurities are of the same type as the well region, and these impurity concentration distributions are set up in the well region.

The invention is defined in the accompanying claims.

In accordance with an embodiment, the Schottky forming material is TiN. One of the main concerns when a metal comes in contact with Silicon is that under certain condition (e.g. high temperature annealing) an undesirable silicidation process can occur. This is common when most of the metals come in contact with Si and limits the usefulness of the Schottky diode since such an uncontrolled silicidation will change vital parameters of the diode (i.e. forward voltage drop). This is a particular problem in CMOS processes which typically use such high temperature annealing. When a Schottky contact is formed with TiN as a metal, since TiN exhibits better stability versus silicidation compared to pure metals, the performance of the Schottky is greatly improved.

Furthermore, most metal-semiconductor contacts have $V_f$ which is fixed because it depends mainly on intrinsic properties of the contact such as barrier height. The Schottky diode proposed has a tuneable barrier height, and hence tuneable $V_f$, making it useful for a wider range of applications.

Figure 6:
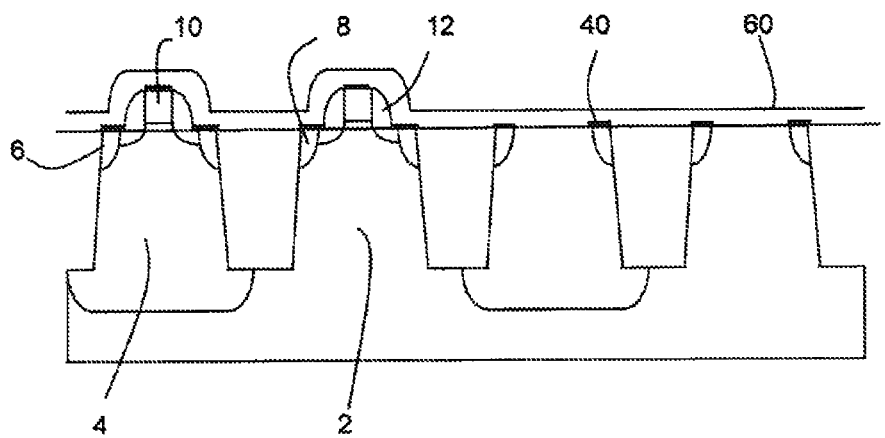
Figure 7:
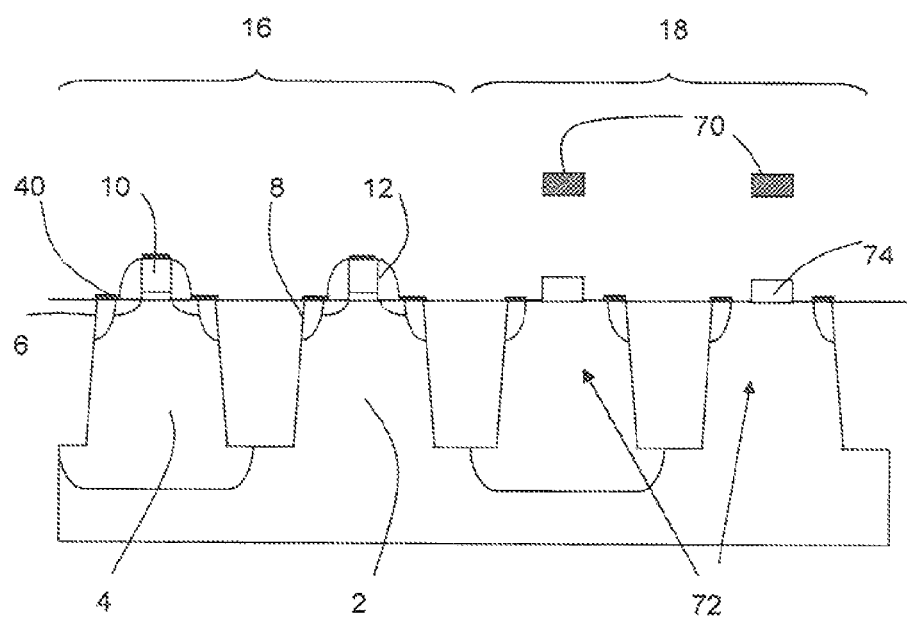
Figure 8:
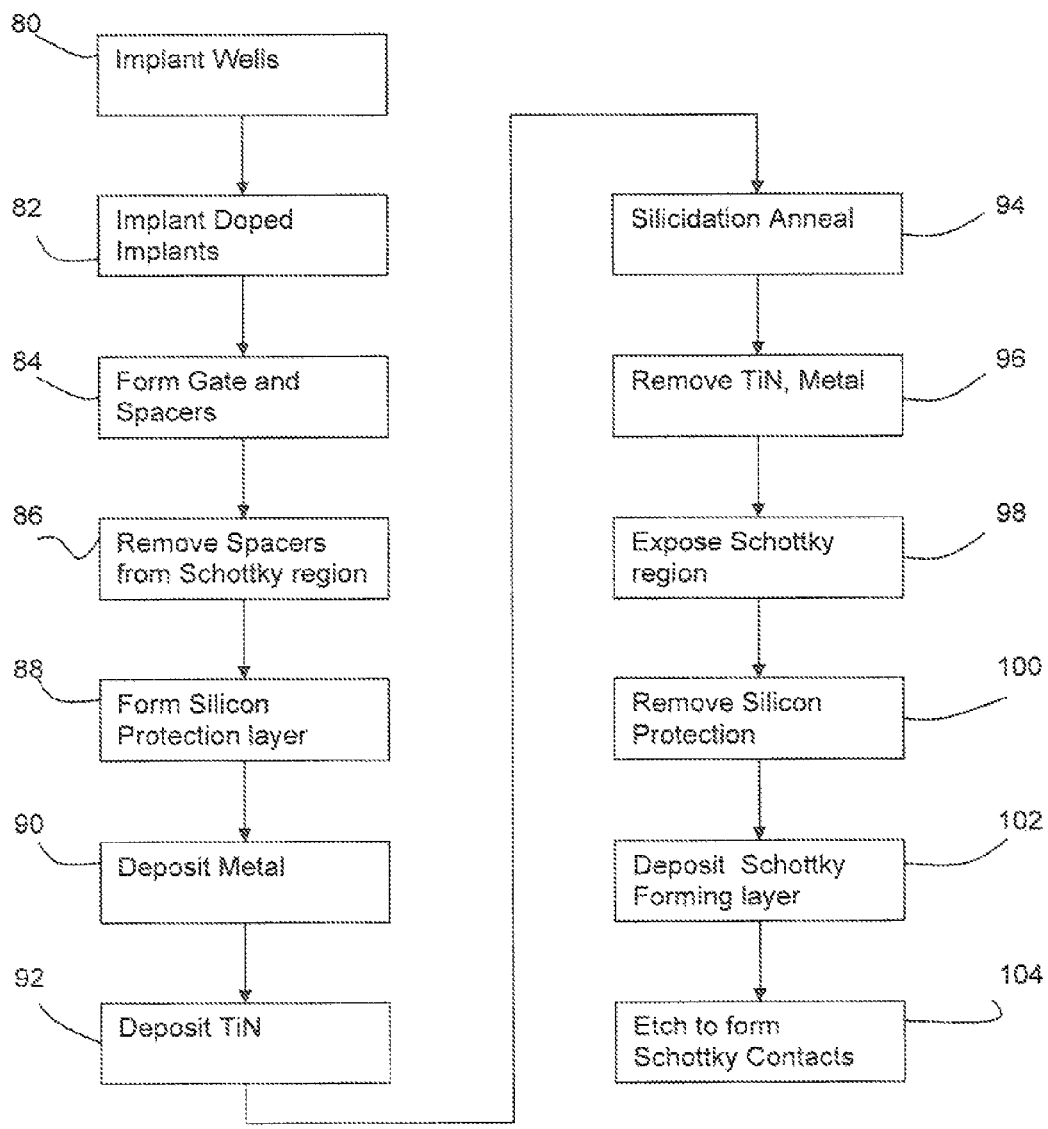

Embodiments of the invention will now be described, purely by way of example, with reference to the accompanying drawings, in which:

FIGS. 1 to 7 show stages in a method according to an embodiment of the invention; and FIG. 8 is a flow diagram setting out the steps in the method shown in FIGS. 1 to 7.

The same or similar components are given the same reference numbers in different Figures and the description relating to those components is not in general repeated.

Referring to FIGS. 1 to 7, the processing steps used in the embodiment to form a Schottky diode are shown schematically. In the Figures, the left half of each Figure relates to the processing in a region 16 of a silicon semiconductor wafer 14 with CMOS devices, and the right half of each Figure shows the processing of a Schottky barrier device in a region 18 of a semiconductor wafer processed to form Schottky diodes. In each case, the processing on both p-wells 2 and n-wells 4 is shown.

The processing starts off as a standard CMOS process but with certain active areas of the wafers reserved for Schottky, region 18 of FIG. 1. During these steps of a standard CMOS process, the active areas receive implants (step 80, FIG. 8) for p-type wells 2 and n-type wells 4. Then, doped p+ implants 6 or n+ implants 8 are formed (step 82) at the edges of the active area, respectively, during CMOS standard source drain implants.

Although these implants form the source and drain in the CMOS region 16, they are used to form contacts to the Schottky region. Accordingly, in the Schottky region, n+ implants 8 are implanted into the n-type wells 4 and p-type implants 6 are implanted into the p-wells 2. This contrast with the CMOS region where the implants are the opposite conductivity type to the wells.

A gate stack 10 and spacers 12 are formed on the MOSFETS (step 84) but are etched away (step 86) from the active reserved for Schottky, leading to the arrangement of FIG. 1.

Figure 2:
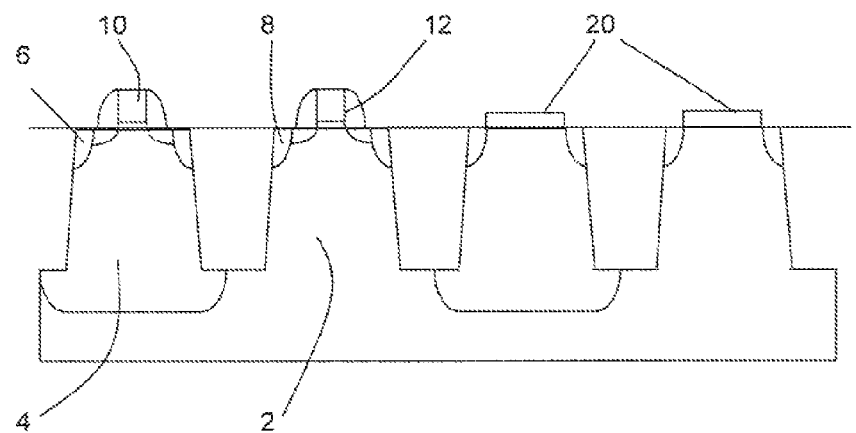
Figure 3:
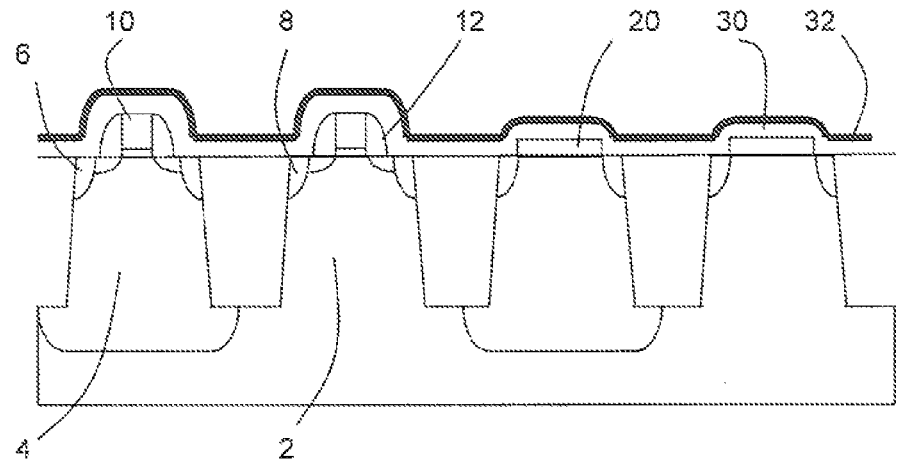

Referring to FIGS. 2 and 8, the next step 88 uses a special mask before silicidation which is generally available in CMOS technology nodes. The step 88 deposits a silicon protection layer 20 (usually oxide) to cover certain areas in order to avoid silicidation. This silicon protection layer 20, known by the abbreviation "siprot", sometimes "locsal", is deposited everywhere on the wafer and then etched away from areas that require silicidation using the aforementioned mask. Accordingly, using this step the silicon protection layer 20 is retained only on the n-type and p-type wells 2,4 between the p+ and n+ implants 6,8 in the region of the wafer reserved for the Schottky diode Then, referring to FIG. 3, the wafer is put through a conventional silicidation process. A metal 30 to be silicided is deposited (step 90) over the full surface of the wafer and on top of that a thick TiN layer 32 is deposited (step 92).

Figure 4:
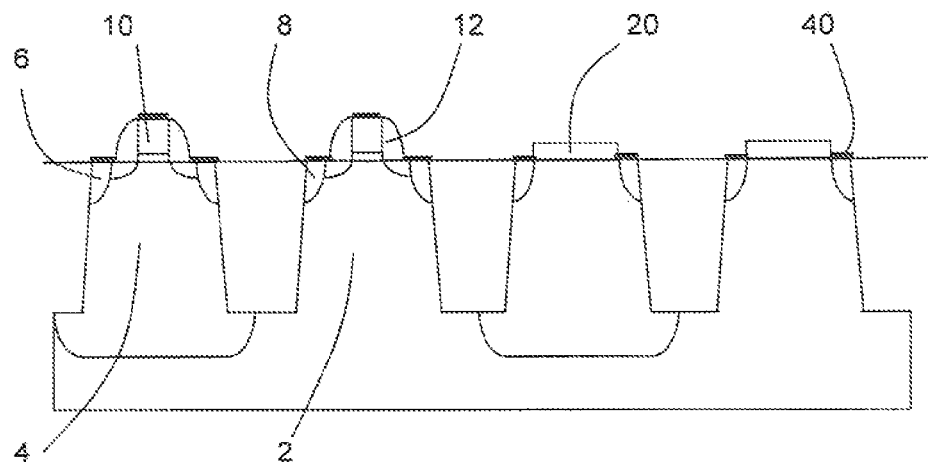
Figure 5:
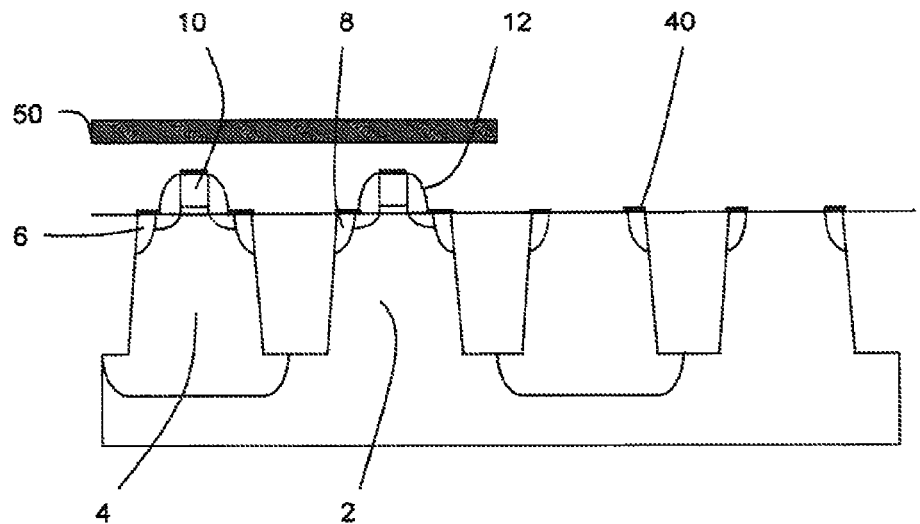

Referring to FIG. 4, a first silicidation anneal (step 94) is then performed at relative low temperature to form conductive metal silicides 40 on the p+ and n+ doped implants 6,8 and to form metal oxides on the silicon protection layer 20

The TiN layer is removed and then the unsilicided metal is also removed selectively to silicide (step 96). At the same time any metal and/or oxide remaining on top of the silicon protection layer 20 is also removed to arrive at the step shown in FIG. 4, with the conductive metal silicides formed over the implants.

At this point an extra lithography step is needed compared with most conventional processes. This step 98 exposes only the Schottky active areas, using mask 50. Then the silicon protection layer 20 layer is removed (step 100) by a wet etch to arrive at the step shown in FIG. 5.

As shown in FIG. 6, a Schottky forming layer 60 is deposited (step 102) over the surface of the wafer. In the embodiment, the Schottky forming layer 60 is of TiN. The thickness of this layer can be chosen in such a way as to give the work function we desire since there is a dependence between TiN thickness and work function. In a preferred arrangement the thickness is kept in the range 2 nm to 20 nm which makes it easier to etch.

Finally, using another lithography step, the TiN Schottky forming layer 60 is etched away (step 104) from everywhere apart from the area reserved for the Schottky, leaving Schottky contacts 74 using mask 70. This step is carried out using a TiN dry etch to end up with the TiN/Si Schottky diodes 72 as depicted in FIG. 7.

Optionally, an oxide hard mask may be deposited on top of the TiN before the lithography step in order to avoid resist poisoning from the TiN. If we follow this approach, the dry etch recipe is adapted in order to etch both hard mask and TiN.

Using these steps, the Schottky diodes are formed between the Schottky contacts 74 and p-type and n-type wells 2,4 in the Schottky region 18 in a way that is fully compatible with conventional CMOS processing, in particular with regard both to thermal budget and the compatibility of materials with such CMOS processing.

CMOS transistors of both n-type and p-type are formed on the same wafer 14 in the CMOS region 16.

Since the barrier height of TiN based Schottky diodes is tuneable by varying the thickness of the TiN, it is possible to adjust the barrier height of the Schottky diodes 72.

The process does not require steps available in a specific CMOS process and it is generally applicable to CMOS processes, including at any technology node.

Further, note that the first and second regions 16, 18 do not need to be simply connected—there may be multiple first regions and multiple second regions to arrange for CMOS devices and Schottky devices at the desired locations within the final device.

Although the embodiment described uses TiN as the Schottky metal, the process is not limited to this material but to any material which forms a Schottky barrier with the semiconductor. TaN and W are particularly suitable in this regard, since they are thermally stable and have been used in gate technology. They also have a work function comparable with TiN.

The semiconductor may be any suitable semiconductor—silicon is as is well known by far the most common but the process is not limited to silicon.

The invention claimed is:

1. A method of manufacturing a semiconductor device including a plurality of transistors in a first region and a Schottky device in a second region, the method comprising:
    forming a plurality of n-type doped wells and p-type doped wells in the first region and a plurality of n-type doped wells and p-type doped wells in the second region;
    depositing a protection layer on the exposed semiconductor of each well in the second region;
    forming a silicide on the transistor wells of the first region by depositing a silicidation metal over the surface, annealing to form a silicide of the silicidation metal and removing the silicidation metal leaving the silicide;
    removing the protection layer of each well in the second region;
    depositing a Schottky material over the surface including exposed semiconductor of each well in the second region; and
    etching away the Schottky material except in a contact region in the well or wells in the second region to form a Schottky contact between the Schottky material and the well or wells in the second region.

2. A method according to claim 1 wherein the Schottky material is TiN, TaN or W.

3. A method according to claim 1 wherein the Schottky material is TiN.

4. A method according to claim 1 wherein the step of depositing the Schottky material includes depositing the Schottky material to a predetermined thickness to form a Schottky barrier of corresponding predetermined height.

5. A method according to claim 1 further comprising forming a gate stack between the source and drain regions in wells in the first region to form transistors before the step of depositing a protection layer.

6. A method according to claim 5 further comprising forming spacers around the gate stacks before the step of depositing a protection layer.

7. A method according to claim 5 wherein the transistors formed in the n-type doped wells and p-type doped wells are complementary metal oxide semiconductor transistors.

8. A method according to claim 2 wherein the Schottky material is TiN.

9. A method according to claim 2 wherein the step of depositing the Schottky material includes depositing the Schottky material to a predetermined thickness to form a Schottky barrier of corresponding predetermined height.

10. A method according to claim 3 wherein the step of depositing the Schottky material includes depositing the Schottky material to a predetermined thickness to form a Schottky barrier of corresponding predetermined height.

11. A method according to claim 8 wherein the step of depositing the Schottky material includes depositing the Schottky material to a predetermined thickness to form a Schottky barrier of corresponding predetermined height.

12. A method according to claim 2 further comprising forming a gate stack between the source and drain regions in wells in the first region to form transistors before the step of depositing a protection layer.

13. A method according to claim 3 further comprising forming a gate stack between the source and drain regions in wells in the first region to form transistors before the step of depositing a protection layer.

14. A method according to claim 4 further comprising forming a gate stack between the source and drain regions in wells in the first region to form transistors before the step of depositing a protection layer.

15. A method according to claim 8 further comprising forming a gate stack between the source and drain regions in wells in the first region to form transistors before the step of depositing a protection layer.

16. A method according to claim 6 wherein the transistors formed in the n-type doped wells and p-type doped wells are complementary metal oxide semiconductor transistors.

17. A method according to claim 1, before depositing the protection layer, further comprising:
 implanting p+ type implants in:
  the n-type doped wells in the first region to form source and drain regions of some of said transistors; and
  the p-type doped wells in the second region to form contact regions of the p-type doped wells in the second region.

18. A method according to claim 1, before depositing the protection layer, further comprising:
 implanting n+ type implants in:
  the p-type doped wells in the first region to form source and drain regions of some of said transistors; and
  the n-type doped wells in the second region to form contact regions of the n-type doped wells in the second region.

* * * * *